Aug. 4, 1970 R. W. BOWER ET AL 3,523,042

METHOD OF MAKING BIPOLAR TRANSISTOR DEVICES

Filed Dec. 26, 1967

INVENTORS.
ROBERT W. BOWER,
GORDON A. SHIFRIN,
BY
W. H. MacAllister Jr.
ATTORNEY.

United States Patent Office 3,523,042

Patented Aug. 4, 1970

3,523,042

METHOD OF MAKING BIPOLAR TRANSISTOR DEVICES

Robert W. Bower, Palos Verdes, and Gordon A. Shifrin, Malibu, Calif., assignors to Hughes Aircraft Company, Culver City, Calif., a corporation of Delaware Filed Dec. 26, 1967, Ser. No. 693,352
Int. Cl. H01l 7/00, 7/54
U.S. Cl. 148—1.5 4 Claims

ABSTRACT OF THE DISCLOSURE

Method of making bipolar (junction) transistor devices wherein the base and emitter regions are formed simultaneously by coating the surface of a semiconductor body of a first-conductivity type with a layer of dopant material of the first conductivity type and then bombarding this dopant layer with ions of the opposite conductivity type to drive the atoms from the dopant layer into surface and near-surface portions of the semiconductor body to form an emitter region while the dopant ions themselves travel more deeply within the semiconductor body and are implanted below the emitter region to form a base region.

Figure 1:
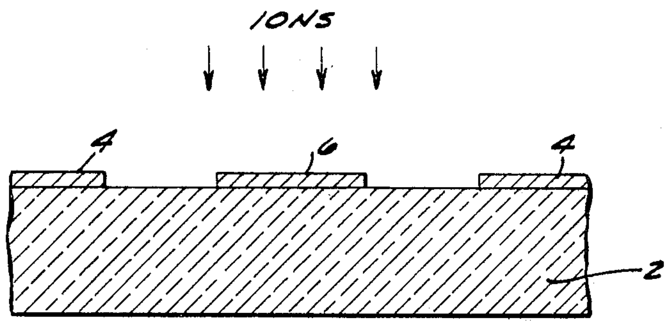

This invention relates to methods for making semiconductor devices and especially transistor devices of a planar junction-type which are also known as planar bipolar transistors. More particularly, the invention relates to methods for fabricating planar junction-type transistor structures by the process of ion implantation.

A planar transistor is one in which both the emitter-base and the collector-base junctions extend to the same surface of the semiconductor body or die. In general, such transistor devices have an emitter region of one type of conductivity disposed within a base region of a second type of conductivity on the same surface of the semiconductor die, with the base region being disposed in the bulk semiconductor which constitutes the collector region. Heretofore planar transistors have been fabricated by the process of diffusion and a typical planar transistor is decribed and shown in U.S. Pat. 3,064,167 to J. A. Hoerni.

The fabrication of planar transistors by diffusion has involved many time consuming and tedious steps. It has been customary to first provide an oxide coating on the surface of a silicon body, for example, and then open up a hole in the oxide coating and diffuse therethrough a conductivity-type-determining impurity to form a base region in a semiconductor body of opposite conductivity type to that of the semiconductor or silicon body. This hole is then closed by oxidizing the silicon body surface exposed therein and a smaller hole is opened within this just closed portion of the oxide. Another conductivity-type-determining impurity is then diffused through this smaller hole to form an emitter region within the previously formed base region which emitter region is of opposite conductivity type to that of the base region. This is substantially the procedure taught by Hoerni in his aforementioned patent. Thus, there are two oxide-forming steps involved and at least two oxide etching or opening steps required. In addition there are two separate and distinct diffusion operations involving different materials to form the base and emitter regions.

It is therefore an object of the present invention to provide an improved process for making planar transistors.

Another object of the invention is to provide an improved method for simultaneously forming both the base and emitter regions in a semiconductor body to thereby form a planar transistor device.

These and other objects and advantages of the invention are realized by a two-step process in which a dopant layer of conductivity material of the same type of conductivity as the starting semiconductor body is applied to the surface of this semiconductor body and then irradiated with ions of an impurity capable of establishing the opposite type of conductivity in the semiconductor body. The bombarding ions not only drive atoms of the dopant material into the semiconductor body to form an emitter region but these ions continue on into the semiconductor crystal structure to establish a base region of opposite conductivity therein under the emitter region. After the attainment of base and emitter regions of the desired geometries, the applied dopant layer may be removed.

Figure 2:
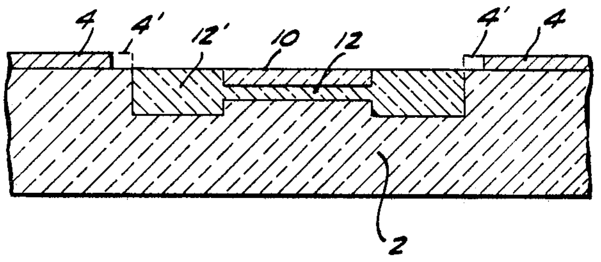

The invention will be described in greater detail by reference to the drawings in which:

FIG. 1 is a cross-sectional elevational view of a semiconductor body being processed according to the method of the invention to form a planar junction transistor; and FIG. 2 is a cross-sectional elevational view of a planar junction transistor fabricated according to the process of the invention.

As used herein the term "impurity" is employed to designate a material which when intentionally incorporated into the crystal lattice structure of a semiconductor crystalline body establishes a particular type of current conductivity therein. Thus, an impurity atom containing at least one more valence electron than an atom of a semiconductor material is termed an N-type (negative) impurity or donor since it contributes electrons for current conduction in the semiconductor crystal lattice structure. An impurity atom containing at least one less valence electron than an atom of the semiconductor material is termed a P-type (positive) impurities or an acceptor since it contributes "holes" (or has vacancies which accept electrons) for current conduction.

A semiconductor body into which such conductivity-type-determining impurities have been introduced is said to be "doped" and is p-type or N-type depending upon the conductivity-type established by the impurity incorporated therein. According to the present invention the method for introducing such conductivity-type-determining impurities into a semiconductor body is that of ion implantation. In contrast to the diffusion techniques of the prior art of introducing such impurities into a semiconductor body which impurities diffuse into the body in at least two directions (e.g. vertically and laterally), ion implanted impurities may be made to penetrate the semiconductor body in only one direction (vertically). In the diffusion process the atoms capable of establishing the requisite conductivity are usually in the vapor state and are not controllable except by thermodynamic techniques. In effect, the atoms in a diffusion process "drift" into contact with an exposed surfaces of a semiconductor body and continued to drift in response to concentration gradients into the semiconductor body in a more or less random fashion in accordance with thermodynamic principles. In the process of direct ion implantation impurity atoms, which are otherwise of neutral electrical charge or polarity, may be given a predetermined electrical charge or "ionized." By means of electric or magnetic fields, these ions may then be formed into beams of various cross-sectional diameters and shapes and may also be caused to travel in predetermined directions at predetermined velocities much like the electrons in an electron beam. Therefore instead of drifting into the lattice structure of a semiconductor body in random directions, these ions may be made to enter the lattice in a predetermined direction and may be positioned where desired therein. In addition, the concentration of such impurities in the semiconductor body may be readily controllable and may be made uniform or graded throughout the implanted region as desired. Thus a region of given conductivity type of precise geometry and depth may be established in any selected portion of a semiconductor body. This process of ionizing the atoms of a conductivity-type-determining impurity and then directly implanting such ions in the semiconductor crystal lattice structure is referred to as direct ion implantation. In a related process, called indirect ion implantation, the supply of conductivity-type-determining impurity atoms is in the form of a layer of impurity or dopant material applied on a surface of a semiconductor body. By bombarding this dopant layer with ions the resulting collisions between the bombarding ions and the atoms of the impurity layer results in a transfer of momentum to the impurity atoms so that these impurity atoms are driven from the dopant layer into the semiconductor body along with the ions bombarding the layer. The implanted atoms from the dopant layer may therefore be utilized to establish a desired type of conductivity in the semiconductor body.

Referring now to the drawings, the fabrication of a planar transistor device will be described in connection with FIGS. 1 and 2. In FIG. 1 a semiconductor body 2, which exemplarily may be of N-type silicon, is shown. An initial step in the fabrication of a device of this type may be the formation of a thick layer 4 material on the surface of peripheral portions of the semiconductor body 2 which layer is capable of preventing ions from reaching the underlying silicon body. A typical material for this purpose may be silicon oxide. Another suitable material is silicon nitride. Since portions of the semiconductor body underlying this mask will eventually constitute the collector region of the transistor device, this layer 4 may be electrically conductive so as to serve not only as a mask against ion implantation or penetration but also as an electrically conductive contact to the collector region. A suitable metallic material for this purpose in the case of N-type silicon may be an alloy of gold and antimony.

It will be appreciated that the velocity of the ions to be utilized and the depth of implantation desired will, in general, determine the minimum thickness of the mask layer 4. As a general rule, the thickness of the mask layer 4 should at least exceed the depth of ion penetration desired in the semiconductor body 2. Typically for low energy ion implantation and penetration depths of from 0.2 to 0.6 micron, a silicon oxide layer of about 0.1 to about 0.6 micron thick may be used. In the case of high energy ion implantation a silicon dioxide mask of about 1.0 micron thickness is satisfactory. The mask layer 4 may be formed to the desired thickness simply by oxidizing surface portions of the semiconductor body 2 in accordance with teachings well known in the art. For a metallic masking and contact layer the thickness may be about 0.1 micron for low energy implantation and about 0.6 micron for high energy implantations. A metallic mask may be formed by vapor-deposition or by plating procedures well known in the art. No matter what the mask material employed is, it may be first formed as a continuous layer over the entire surface of the semiconductor body and then formed into the desired pattern by conventional photoresist and etching procedures.

As noted previously, the mask 4 is disposed on peripheral portions of the upper surface of the semiconductor body 2 so that an annular central portion of the surface of the semiconductor body is exposed therewithin. A layer 6 of dopant material is next disposed symmetrically on the exposed surface of the semiconductor body 2 and spaced from the mask material 4. This dopant layer 6 may be of any suitable N-type impurity such as antimony, for example. The dopant layer 6 may be applied by any convenient technique, as by vapor deposition. The thickness of the antimony dopant layer 6 thus formed should be less than the thickness of the mask 4.

The semiconductor body as shown in FIG. 1 is then placed in a suitable apparatus for forming and directing a beam of ions of a P-type impurity toward the surface of the semiconductor body on which the mask and dopant layers are disposed. Either a beam of ions broad enough to blanket the entire surface of the semiconductor body or a narrower beam which is scanned across the surface may be employed.The P-type ions penetrate the dopant layer 6 and collide with atoms of the material of this dopant layer, transferring momentum thereto so as to drive these dopant atoms into the underlying surface and near-surface portions of the semiconductor body immediately beneath the dopant layer. A substantial number of the P-type ions continue to penetrate through the dopant layer and into the semiconductor body so as to finally come to rest in sub-surface portions of the semiconductor body under the aforesaid surface and near-surface portions in which the atoms of the dopant material have been implanted. Thus two regions 10 and 12 of mutually opposite conductivity type are established in the semiconductor body, one by indirect ion implantation and the other by direct implantation. Since the dopant atoms and the ions penetrate into the semiconductor body in paths substantially perpendicular to the surface thereof, respective perimeters of the implanted regions are in substantially perfect alignment with the edges of the mask layer 6 and the dopant layer. P-type impurity ions are also directly implanted not only in subsurface but also surface and near-surface portions of the semiconductor body in the space between the dopant layer 6 and the mask layer 4 as shown in FIG. 2. The atoms from the applied dopant layer 6 in the surface and near-surface portions of the semiconductor body establish a region 10 thereat of N-type conductivity which region constitutes the emitter portion of the transistor device. The P-type ions establish, under the emitter region 10, a region 12 of P-type conductivity which also surrounds the N-type region formed so as to be exposed on surrounding surfaces within the space or gap between the dopant layer 6 and the mask layer 4. The P-type region 12 thus formed constitutes the base region of the transistor device and exposed surface portions 12' of the base region may be utilized for providing electrical connection to the base region.

The final step in the process of the invention may be removal of the applied dopant layer 6 from the surface of the semiconductor body. This may be attained either mechanically or chemically as by chemical etching. At the same time, and if a metallic mask 4 was employed, the inner peripheral portions 4' of the mask may be etched back so as to prevent electrically shorting the collector-base regions to each other at the point where the inner edge of the mask is in substantially perfect alignment with the edge of the P-type base region 12 and may be in contact therewith.

The exposed surface of the semiconductor body may now be protected against the deleterious effects of the ambient as by oxidizing the surface thereof according to the techniques well known in the art. It will be understood that openings will be left in this protective coating in order to permit electrical contacts to be provided to the emitter and base regions. Such contacts do not have to be disposed entirely over the emitter and base regions but only to portions thereof.

Apparatus suitable for generating an ion beam for the purposes of the process of the invention is shown and described in the copending application Ser. No. 640,441 entitled "Surface Ionization Apparatus," filed May 16, 1967, by R. G. Wilson et al. and assigned to the instant assignee. The apparatus comprises an ion beam source and is adapted to be disposed in an evacuated chamber with the semiconductor body which it is desired to irradiate with ions. The semiconductor body will be positioned in this chamber with respect to the ion source so as to be impinged by the ion beam emerging therefrom which beam may be accelerated by means of suitable electrodes.

While the fabrication of an n-p-n transistor device has been described, it will be understood that transistors of p-n-p configuration may be similarly obtained. Thus the semiconductod body may initially be P-type and the applied dopant layer may be a P-type impurity such as boron or aluminum, for example, in which case the ion beam may be of N-type impurity ions such as antimony for example.

There thus has been shown and described an improved method for fabricating planar transistor devices. In the process of the invention the emitter and base regions are formed simultaneously and may be of any desired geometry. By the process of the invention such planar transistor devices are fabricated with fewer processing steps than heretofore practiced. Transistor devices fabricated according to the invention possess characteristics not heretofore obtainable by prior art processes such as diffusion. Thus the implanted emitter and base regions may have any desired impurity concentration to any predetermined depth. In other words the impurity concentration of the emitter and base regions fabricated according to the process of the present invention may be uniform and not graded as was characteristic of such regions formed by diffusion.

What is claimed is:

1. The method of fabricating a semiconductor device comprising the steps of:

(a) applying a layer of a first type of conductivity-type-determining material on a surface of a semiconductor body;

(b) and causing ions of a second type of conductivity-type-determining material to impinge on said layer, whereby atoms of said first type of conductivity-type-determining material are driven into surface and near-surface regions of said semiconductor body to establish therein said first type of conductivity, and said ions are implanted in at least a sub-surface region of said semiconductor body beneath said surface and near-surface regions to establish said second type of conductivity in said sub-surface region.

2. The method of fabricating a planar transistor device comprising the steps of:

(a) applying a layer of a first type of conductivity-type-determining material on the surface of a semiconductor body having said first type of conductivity;

(b) and irradiating at least said layer with ions of a second type of conductivity-type-determining material whereby a surface region having said first type of conductivity is established in said semiconductor body by atoms from said layer and a sub-surface region beneath said surface region is established in said semiconductor body by ions of said second type of conductivity-type-determining material, said surface region being separated from un-implanted portions of said semiconductor body having said first type of conductivity by said sub-surface region having said second type of conductivity.

3. The method of fabricating a planar transistor device comprising the steps of:

(a) applying a layer of a P-type impurity material on a surface of a P-type semiconductor body;

(b) and irradiating at least said layer with ions of an N-type impurity material whereby a P-type surface region is established in said semiconductor body by atoms from said layer and an N-type sub-surface region beneath said P-type surface regiion is established in said semiconductor body by ions of said N-type impurity material, said P-type surface region being separated from un-implanted P-type portions of said semiconductor body by said N-type sub-surface region.

4. The method of fabricating a planar transistor device comprising the steps of:

(a) applying a layer of an N-type impurity material on a surface of an N-type semiconductor body;

(b) and irradiating at least said layer with ions of a P-type impurity material whereby an N-type surface region is established in said semiconductor body by atoms from said layer and a P-type sub-surface region beneath said N-type surface region is established in said semiconductor body by ions of said P-type impurity material, said N-type surface region being separated from un-implanted N-type portions of said semiconductor body by said P-type sub-surface region.

References Cited

UNITED STATES PATENTS 3,413,531 11/1968 Leith.

L. DEWAYNE RUTLEDGE, Primary Examiner

R. A. LESTER, Assistant Examiner

U.S. Cl. X.R.

29—578; 148—186, 187